United States Patent [19]

Nagashima

[11] 4,184,065

[45] Jan. 15, 1980

[54] HEATING APPARATUS HAVING ELLIPSOIDAL REFLECTING MIRROR

[75] Inventor: Kanji Nagashima, Otsu, Japan

[73] Assignee: Nichiden Machinery, Limited, Otsu, Japan

[21] Appl. No.: 898,184

[22] Filed: Apr. 20, 1978

[30] Foreign Application Priority Data

Apr. 28, 1977 [JP] Japan ............................. 52-49173

[51] Int. Cl.$^2$ ............................................. H05B 1/00
[52] U.S. Cl. .................................... 219/349; 219/348; 219/405; 156/620
[58] Field of Search ............................... 219/347–349, 219/405, 411; 13/DIG. 1; 350/243, 294; 156/620

[56] References Cited

U.S. PATENT DOCUMENTS

| | | | |
|---|---|---|---|
| 3,001,055 | 9/1961 | Lozier et al. | 350/293 |
| 3,460,930 | 8/1969 | Pityo | 350/294 |
| 3,600,553 | 8/1971 | Costello | 219/349 |
| 3,761,677 | 9/1973 | Mizutani et al. | 156/620 |
| 3,763,348 | 10/1973 | Costello | 219/349 |
| 3,801,773 | 4/1974 | Matsumi | 219/405 |
| 3,983,039 | 9/1976 | Eastland | 219/349 |

FOREIGN PATENT DOCUMENTS 291972 7/1965 Netherlands ........................... 156/620

Primary Examiner—Bruce A. Reynolds
Assistant Examiner—Bernard Roskoski
Attorney, Agent, or Firm—W. G. Fasse; D. F. Gould

[57] ABSTRACT

A heating apparatus especially suitable for use in a crystal growth system, comprises a combination of a high pressure xenon arc discharge lamp and an ellipsoidal reflecting mirror having first and second focal points to heat a material feed rod by concentrated infrared radiation from the xenon lamp. The reflecting mirror is divided into at least two mirror portions between which a substantially straight additional part of a predetermined length is interposed. The additional part makes the distance between the two foci longer by said predetermined length. The center positions of the xenon lamp and the feed rod are located respectively at points apart from each of the focal points toward each other at a distance corresponding to the predetermined length, so as to obtain a desirable temperature distribution around the rod relative to a major horizontal axial plane of the ellipsoidal reflecting mirror. In addition, a quarter mirror portion behind the xenon lamp is shifted up or downwardly to defocus the image of the radiant heat for achieving a desirable temperature distribution in a vertical plane.

10 Claims, 7 Drawing Figures

U.S. Patent     Jan. 15, 1980     4,184,065
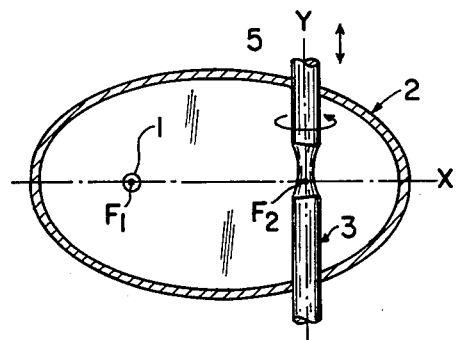
FIG.1
PRIOR ART
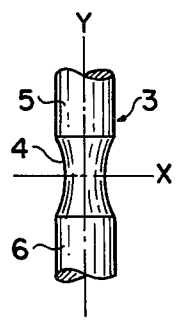
FIG.2(a)
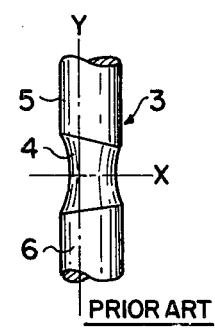
FIG.2(b)
PRIOR ART
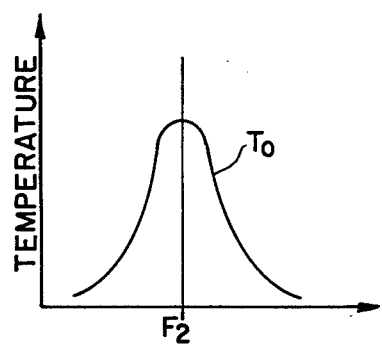
FIG.3
PRIOR ART
FIG.4
FIG.5
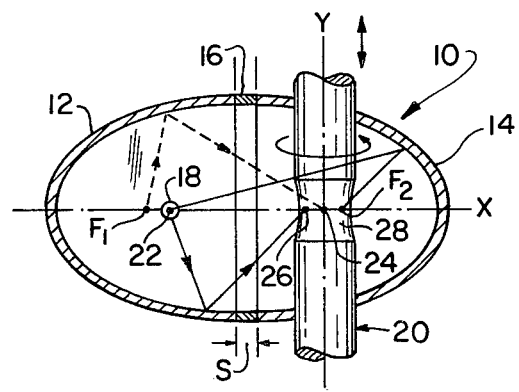
FIG.6

HEATING APPARATUS HAVING ELLIPSOIDAL REFLECTING MIRROR

BACKGROUND OF THE INVENTION

This invention relates to a heating apparatus, particularly to a thermal imaging system employed in a crystal growing system which comprises an ellipsoidal reflecting mirror provided with two foci, and a heat source whereby a substance to be heated may be disposed on a line connecting these two foci to heat the substance by a concentrated infrared radiation from the heat source.

Such infrared radiation heating devices are utilized for the crystallization of various materials, such as refractory oxides by melting a material feed rod by using techniques based on either the floating zone principle or the pedestal principle, as disclosed, for example, in U.S. Pat. Nos. 3,761,677 and 3,817,710 or in IEEE Transactions on Magnetics, Vol. MAG-5, No. 3, September 1969, pages 285–289 or in NEC Research & Development No. 33, April 1974, pages 86–92, and Journal of Crystal Growth 39 (1977), pages 211–215. These U.S. Patents and literature show systems for growing single crystals by the floating zone method. In U.S. Pat. No. 3,761,677, the radiant energy is supplied by a pair of halogen lamps, whereas U.S. Pat. No. 3,817,710 and the literature show the use of a single lamp such as a halogen lamp or a xenon lamp for producing the radiant energy. For example, in a conventional heating apparatus using a single heat source the structure of the apparatus is simplified as shown in FIG. 1, in which the center of a xenon arc lamp or of a halogen lamp 1 forming the heat source is positioned at a first focus F1 of an ellipsoidal or prolate spherical reflecting mirror 2. A central junction between a substance 3 of a seed crystal and a polycrystalline material feed rod 5 to be heated, is positioned at a second focus F2 of the ellipsoidal or prolate spherical reflecting mirror 2, so that the radiated energy of the lamp 1 is concentrated at the second focus F2. Thus, the junction between the seed crystal and the material feed rod is partially heated to a high temperature to form a molten zone 4. In this case the heated substance at the second focus F2 is rotated at a fixed r.p.m. rate about an axis Y extending perpendicularly to a major axis X. In addition the substance is moved up or down in the direction of the axis Y at a very slow fixed rate.

When a high power xenon arc discharge lamp is used instead of the halogen lamp as a heat source 1 for the crystallization at high melting temperatures near 3000° C., the concentration of radiation from the xenon lamp becomes too sharp due to the spot-like small heat source of the xenon lamp as compared to the halogen lamp. Such sharp concentration of the radiant energy produces a thermal image having a temperature distribution in the horizontal direction so that the maximum point is at the second focus F2 and the peaked portion decreases steeply in the vicinity of the second focus F2, as shown in a temperature distribution curve To of FIG. 3. Besides, although the heating apparatus must be so constructed that the vertical rotating axis Y of the heated substance 3 is positioned correctly at the second focus F2, it is somewhat difficult practically to let the rotating axis Y coincide with a center axis of a molten zone 4 in the junction of the seed crystal 6 and the polycrystalline feed rod 5 supported by upper and lower holding shafts, because the molten zone 4 in the vicinity of the second focus F2 is viscous due to the melting, whereby the center line of the rotating molten zone 4 tends to deviate from the axis Y. Therefore, a further distant side of the substance 3 from the second focus F2 in the horizontal direction is heated less, while the other opposite side of the substance 3 is strongly heated. As shown in FIG. 2(a), according to the invention it is desired to have a boundary line of the molten zone 4 which extends in parallel to the axis X for uniform heating. However, as shown in FIG. 2(b) on an enlarged scale relative to FIG. 1, the boundary lines between the molten zone 4 and the solid state portions of the polycrystalline feed rod 5 and the crystal seed 6 become inclined against the axis X in the conventional apparatus. Thus, prior art devices do not provide the desirable state as shown in FIG. 2(a). The facts shown in FIG. 2(b) cause an undesirable crystal growth. Moreover, when some parts along the circumference between the polycrystalline feed rod 5 and the molten zone 4 are left unmelted, the continuation of the single crystal growth cannot be maintained.

OBJECTS OF THE INVENTION

In view of the above, it is the aim of the invention to achieve the following objects singly or in combination:

to overcome the disadvantages of the prior art, more specifically, to improve the temperature distribution of the thermal image so as to assure a uniform heating of the melting zone;

to provide an improved heating apparatus comprising an ellipsoidally shaped reflecting mirror within which the outer surface of a material rod to be heated is exposed to an uniform and concentrated radiant energy; and to provide a heating apparatus of the radiation concentrating type, which is employed in the system for the crystallization of refractory oxides, particularly for growing a larger crystal under high or melting temperatures with a broader peaked range.

SUMMARY OF THE INVENTION

According to the invention, the present heating apparatus comprises an ellipsoidal or prolate spherical reflecting mirror provided with first and second foci and including a major axis. A radiant heat source is disposed on the line between the first and second foci to radiate infrared rays, the thermal image of which is concentrated by the ellipsoidal, reflecting mirror at the second focus. A substance to be heated is disposed on the line between the first and second foci. The improvement in the foregoing apparatus is characterized in that the reflecting mirror is divided into at least two mirror part portions by a vertical plane extending substantially through the middle of the major axis of the ellipsoidal, reflecting mirror, and that a substantially straight additional part having a given length is inserted between the divided mirror portions to elongate the distance between the two foci by said given length. Within this reflecting mirror the heat source is disposed on the major axis at a position spaced from the first focus toward the second focus by a distance corresponding to said given length. The center axis of the substance to be heated is disposed in the same or similar manner on the major axis at a position spaced from the second focus toward the first focus by a distance also corresponding to said given length. Said given length is preferably selected to be substantially equal to or less than the radius of the molten zone of the rod-like substance to be heated as shown in FIG. 4, whereby to heat the outer surface of the substance to a uniform temperature distribution in the peaked portion shown in FIG. 3.

The heating apparatus of this invention is suitable for use in the growing of single crystals in a system utilizing the floating zone technique, which is used for an easy preparation of single crystals of magnetic materials, such as orthoferrites and spinel ferrites, dielectric materials such as lithium niobate and lithium tantalate, and optical crystals.

BRIEF FIGURE DESCRIPTION

In order that the invention may be clearly understood, it will not be described by way of example, with reference to the accompanying drawings, wherein:

FIG. 1 illustrates a simple construction of the heating apparatus used in conventional single crystal growing systems;

FIGS. 2(a) and (b) each show an enlarged partial plan view of the material substance of FIG. 1 in different types of melting, whereby FIG. 2(a) shows the desirable uniform melting according to the invention whereas FIG. 2(b) shows the non-uniform prior art melting;

FIG. 3 shows a temperature distribution curve near the focus F2 in the horizontal direction of FIG. 1;

FIG. 4 illustrates a simple construction of a heating apparatus of an embodiment in the present invention;

FIG. 5 shows temperature distribution curves near the focus of the heating apparatus of FIG. 4; and FIG. 6 illustrates a device for growing single crystals, which employs the heating apparatus of the present invention.

DETAILED DESCRIPTION OF PREFERRED EXAMPLE EMBODIMENTS

FIG. 4 illustrates an embodiment of the present invention. The present heating apparatus comprises an ellipsoidal reflecting mirror 10 which is divided into two mirror portions 12 and 14 hereinafter called first and second divided mirrors. A substantially straight additional part or spacer 16 having a given length S as viewed in the X-direction is inserted between the portions 12 and 14 so as to increase the distance between the two foci F1 and F2 by the given length S. Within the mirror 10, a radiant heat source 18, such as a xenon arc discharge lamp, is disposed at a position 22 near the first focus F1 of the first divided mirror 12 on the major axis X of the mirror 10. A rod 20 of a substance to be heated is disposed on a vertical axis Y and at a position 24 near the second focus F2 of the second divided mirror 14 on the major axis X of the mirror 10.

The distance between the first focus F1 of the first divided mirror 12 and the second focus F2 of the second divided mirror 14 is increased along to the horizontal direction of the major axis X. When the heat source 18 is located at the position 22 spaced from the first focus F1 on the major axis X toward the second focus F2 at a distance of the length S, infrared heat rays concentrate on the second focus F2 by reflection from the second divided mirror 14. Thus, the rod 20 is heated mainly on the right-hand surface by the second divided mirror 14, if the length S of the spacer 16 corresponds substantially to or is less than the radius of the molten zone 28 of the rod 20, and if the axis Y is located at a position 24 spaced at a distance S from the second focus F2 on the major axis X of the reflecting mirror 10, toward the first focus F1 as shown in FIG. 4.

On the other hand, infrared heat rays radiated from the heat source 18 located at the position 22 are reflected by the first divided mirror 12 and concentrate on a position 26 apart from the second focus F2 toward the position 22. Since the position 26 corresponds to the other or left side surface of the rod 20, and if the heat source 18 is disposed at the first focus F1, infrared heat rays will be reflected by the first divided mirror 12 and concentrate on the position 26 at a distance of twice the length S from the second focus F2 toward the first focus F1. Therefore, when the center of the heat source 18 is precisely disposed at the position 22 spaced by the given length S from the first focus F1 toward the second focus F2, the incident angle between the heat rays and the normal of each point on the first divided mirror 12 becomes smaller than in the case when the heat source is disposed at the focus F1. As a result, the heat rays reflected by the first divided mirror 12 concentrate at the position 26.

Accordingly, the heating temperature distribution in the vicinity of a molten zone 28 of the junction of the rod 20 to be heated is spread as compared to that of the conventional apparatus. As shown in FIG. 5, the solid line curve T12 illustrates the temperature distribution in a device of the present invention which is obtained from the temperature distributions of a curve T1 in the vicinity of the position 26 and of a curve T2 near the focus F2, as indicated by broken or dashed lines. The temperature distribution curve T12 has a maximum temperature range broader than the dashed line curve To of a conventional apparatus as described above with reference to FIG. 3. Therefore, it is an advantage of the invention that the heating temperature distribution becomes flat and uniform in the horizontal direction because the material rod 20 having a radius corresponding substantially to S is positioned with the rotating axis Y as the middle portion of the maximum temperature range and between the position 26 and the focus F2 on the horizontal major axis X.

In this case, even if a cross section of the molten zone 28 in the direction of the major axis X deviates slightly from the position 24, any partial insufficient heating can be prevented by the flat and broadly peaked range of the heating temperature distribution in the vicinity of the molten zone 28, so as to achieve the single crystal growth under the best possible conditions. As shown in FIG. 5, the temperature of the positions 24, 26 and F2 are substantially the same as those corresponding to the points 31, 32, and 33 respectively on the curve T12. By comparing the points 34, 35, and 36 respectively on the curve To shown by a dashed line in FIG. 5 and in full line in FIG. 3 with the points 31, 32, 33, it will be appreciated that the improved configuration of the temperature distribution in an apparatus of the present invention has distinctly excellent temperature distribution characteristics which are smooth and uniform in the vicinity of the molten zone 28.

As hereinbefore explained, the main feature of the present invention is characterized in that the reflecting mirror is divided into at least two mirror portions 12 and 14 by a vertical plane crossing about through the middle portion of the major axis of the ellipsoidal reflecting mirror, and by inserting a substantially straight additional spacer 16 having a given length S between the two divided mirror portions 12,14. Thus, the distance between the two foci F1, F2 is elongated by a distance corresponding to the given length S. It is recommended to select the length S to be substantially equal to or is less than the radius of the heated, molten zone 28 of the rod 20 as shown in FIG. 4 and to locate the radiant heat source at a distance corresponding to the length S from one of the foci toward the other focus and to locate the center 24 of the substance or rod 20 at a distance corresponding substantially to the length S from the other focus, toward one focus. The present apparatus provides heating means for obtaining a desired horizontal temperature distribution with a gentle inclination and uniformity of the peak portion in the vicinity of the molten zone, and has the advantage of avoiding the undesirable partial insufficient heating in the molten zone in a surprisingly simple manner. It is noted that the given length S, if selected as described above and shown in FIG. 4 will result in a uniform heating of both outer surface sides of the molten zone 28 of the rod 20 substantially to the peak temperature.

FIG. 6 shows a single crystal growing device 40 using an infrared heating apparatus of the present invention, in which the maximum temperature of about 3000° C. may be maintained continuously at the molten or floating zone 41 by selecting the gas atmosphere and the pressure. A crystal refining process is achieved by a perfectly synchronized rotation of the upper shaft 42 holding a raw material feed rod 43 and the lower shaft 44 supporting a seed crystal 45. According to the present invention, an ellipsoidal reflecting mirror 46 comprises the portions including mirror members 47 and 48 and a spacer 49 therebetween, which are divided by a plane perpendicular to the major ellipsoid axis X. The surface of the mirror members 47 and 48 is gold plated for a better infrared ray reflection and durability. A heat source 50 of a xenon arc lamp of 6.5 kilowatts is located near the focus of the mirror member 47. The feed rod 43 is suspended from the bottom of the upper shaft 42, and the seed crystal is supported on the top of the lower shaft 44. Both the upper and lower shafts are simultaneously driven either upward or downward to keep the focused hot point directed on the part of the crystal growth at a continuously changing rate. The distance between the seed crystal and the feed rod is adjustable and the shafts are individually rotated to grow crystals by the floating zone method. Incidentally, the spacers 16 and 49 may also be gold plated.

The output infrared radiation of the xenon lamp is concentrated on two points lying in the major ellipsoid axis, whereby a wide and stable floating zone is attained by a modified ellipsoidal reflector using the present invention. The enlarged view of the floating zone 41 is always projected onto a front screen 51 of an operation monitor 52 through a lens 53 during operation. Hence, it is possible to perform all kinds of steps necessary for the growing of single crystals by observing the melting status as well as the feed rod 43 and seed crystal 45 on the screen. For controlling the conditions of the crystal growth, the gas atmosphere and the pressure, (if necessary a vacuum may be used), are selected with due regard to the formation of a floating zone partition isolated by a transparent quartz tube 53' from the open air. For instance, an inert gas may be supplied at a pressure below 5 Kg/cm$^2$ by way of inlet 54 and outlet 55. For fast heating or cooling of the floating zone 41, and for high efficiency, a cooling system is also installed for the ellipsoidal reflecting mirror 46 and for the xenon lamp 50 as the infrared heat source. Thus, cooling air is circulated through an inlet 56 to the xenon lamp and cooling water is introduced to the outside of the reflecting mirror members. The accurate position of the heat source is achieved by a lamp position adjuster 58, whereby a smooth or flat horizontal peaked temperature distribution on the axis X is provided as shown in FIG. 5.

In addition, the embodiment of FIG. 6 is provided to create the thermal image slightly below the major axis X. That is, three mirror portions 60 of the mirror members 47 may be shifted by a vertical adjustment device 61 in the up or down direction for obtaining a broader peaked temperature range in the vertical direction of the rotating axis Y to facilitate the growth of a large crystal and for providing an after heating effect. The mirror portions 60 of the mirror member 47 comprise a stationary part 62, a first movable part 63, and a second movable part 64. The vertical adjustment device 61 comprises a pair of holders 65, 66 secured to the stationary part 62 for supporting both movable parts 63, 64 which are mounted to the holders 65, 66 by adjusting screws 67, 68; 69, 70 respectively whereby these movable parts 63, 64 may be shifted vertically as indicated by the vertical arrows. If it is necessary, such mirror portions 60 of the ellipsoidal reflecting mirror may be located at a position above or below the major axis X whereby infrared heat rays are concentrated at the upper or lower portion of the second focus F2 and whereby a smooth and broad longitudinal temperature distribution is obtained.

The following provides further information regarding the apparatus illustrated in FIG. 6.

| Item | Rating |
|---|---|
| Power source | Three phase AC line 200V, 50/60Hz, 25kW |
| Heat source 50 | High pressure xenon arc discharge lamp, 6.5kW |
| Cooling system | Water cooling for reflecting mirror flow rate 3 liters/minute Compressed air cooling for the xenon lamp 1000 cubic feet/minute |
| Temperature adjustment | by controlling the lamp current Max. temperature about 3000° C. |
| Crystal diameter | 2300° C. = 10 mm 2400° C. = 8 mm 3000° C. = 6 mm |
| Growth rate | Slow rate: 0.1-1.8 mm/hr, Faster rate: 1-18 mm/hr |
| Shaft rotation rate | Continuously variable in the 6.4-128 rpm range, Synchronized rotation is available |
| Molten zone height adjustment | Gap adjustment range; upper shaft: 100 mm lower shaft: 50 mm Gap adjustment rate; fast rate: 10.8 mm/min slow rate: 0.6-11 mm/hr |
| Atmospheric gas | Pressure: 0-5 kg/cm$^2$ |
| Spacer 49 | Variable with reference to the radius of the molten zone 28 of the feed rod as described above. |

Although the invention has been described with reference to specific example embodiments, it is to be understood that it is intended to cover all modifications and equivalents within the scope of the appended claims.

What is claimed is:

1. A heating apparatus comprising divided ellipsoidal reflecting mirror means having a first mirror member with a first focal point and a second mirror member with a second focal point, said first and second focal points being located on a common axis (X), a single heat source disposed in the vicinity of said first focal point within said reflecting mirror means, means for holding a substance to be heated by the radiation generated by said heat source so that said substance is disposed in the vicinity of said second focal point within said reflecting mirror means, a substantially straight additional spacer member (16 or 49) having a given length in the direction of the common axis (X), said additional spacer member being interposed between said first and second mirror members to correspondingly increase the spacing between the first and second focal points, said heat source having a center located in a first position spaced from said first focal point and wherein said substance to be heated has a molten zone with a center (28) located at a second position spaced apart from said second focal point to obtain a desired substantially uniform temperature distribution all around said substance to be heated.

2. The heating apparatus of claim 1, wherein said heat source is a xenon arc lamp of the short arc type for generating a spotlike intensive radiation.

3. The heating apparatus of claim 1, wherein said substance to be heated has a rod shape and said molten zone having a given radius, and wherein said given length of said spacer member (16, 49) is substantially equal to said given radius of said molten zone.

4. The heating apparatus of claim 1, wherein said reflecting mirror has a major axis, and wherein said heat source and said substance are located on said major axis and between said first and second focal points.

5. The heating apparatus of claim 4, wherein the first position of said heat source is spaced from said first focal point by a distance corresponding to the given length of said additional member, and wherein the second position for said substance is spaced from said second focal point by a distance also corresponding to the given length of said additional member, thereby providing a temperature distribution having a broad peaked portion in the direction of said major axis.

6. The heating apparatus of claim 1, wherein said one mirror member includes a divided mirror portion corresponding in size to about one quarter of the mirror member, said divided mirror portion being positioned slightly below or above a horizontal plane of said reflecting mirror means so as to generate the thermal image below or above said horizontal plane, whereby a desired temperature distribution in both the horizontal and the vertical directions is obtained.

7. The heating apparatus of claim 1, wherein said substance includes a material feed rod, a seed crystal and a junction, said junction being formed at said molten zone which has a given radius so as to grow a desired crystal.

8. The heating apparatus of claim 7, wherein the radius of said molten zone of said feed rod is substantially equal to said given length of said spacer member (16, 49) so as to uniformly heat the outer surface of said rod substantially at the peak temperature.

9. The heating apparatus of claim 7, wherein said length of said spacer member (16, 49) is less than the given radius of the molten zone (28).

10. The heating apparatus of claim 1, wherein said length of said spacer member (16, 49) is less than the given radius of said molten zone.

* * * * *